United States Patent [19]
Taniguchi et al.

[11] Patent Number: 5,314,294
[45] Date of Patent: May 24, 1994

[54] SEMICONDUCTOR SUBSTRATE TRANSPORT ARM FOR SEMICONDUCTOR SUBSTRATE PROCESSING APPARATUS

[75] Inventors: Takao Taniguchi; Hiroshi Sato, both of Fukuoka, Japan

[73] Assignee: Mitsubishi Denki Kabushiki Kaisha, Tokyo, Japan

[21] Appl. No.: 881,061

[22] Filed: May 11, 1992

[30] Foreign Application Priority Data

Jul. 31, 1991 [JP] Japan .................................. 3-191511

[51] Int. Cl.$^5$ ............................................. B25J 18/04
[52] U.S. Cl. ................................... 414/744.6; 901/15; 414/744.5
[58] Field of Search ............... 414/744.6, 744.5, 744.3; 901/15

[56] References Cited

U.S. PATENT DOCUMENTS 5,007,784  4/1991  Genov et al. ................. 414/744.6 X
5,180,276  1/1993  Hendrickson ................. 414/744.5 X

FOREIGN PATENT DOCUMENTS 60-98628    6/1985  Japan .
60-133731   7/1985  Japan .
63-136644   6/1988  Japan .

*Primary Examiner*—Michael S. Huppert
*Assistant Examiner*—Donald W. Underwood
*Attorney, Agent, or Firm*—Leydig, Voit & Mayer

[57] ABSTRACT

A transport arm of a semiconductor substrate transport apparatus carries a semiconductor substrate both into and out of a semiconductor substrate processing chamber in each operation of the transport arm, shortening operation time and prolonging the operating life of the apparatus. First and second arms are rotatably mounted at the leading end of an extensible arm of the semiconductor substrate transport apparatus, each including a substrate holding portion at the leading end for supporting a semiconductor substrate. The first and second arms are turned by an arm driving device while in the semiconductor substrate processing chamber.

4 Claims, 3 Drawing Sheets

5,314,294

SEMICONDUCTOR SUBSTRATE TRANSPORT ARM FOR SEMICONDUCTOR SUBSTRATE PROCESSING APPARATUS

BACKGROUND OF THE INVENTION

1. Field of the Invention

The present invention relates to a semiconductor substrate transport arm for use in a semiconductor substrate transport apparatus for carrying a substrate into and out of a semiconductor substrate processing chamber.

2. Description of the Related Art

FIG. 6 is an outside plan view of a transport arm in a well-known semiconductor substrate transport apparatus. The transport arm has an extensible transport arm 37 capable of moving into and out of a semiconductor substrate processing chamber (not shown) and a semiconductor substrate pan 38 fixed to the leading end of the extensible transport arm 37, for carrying a semiconductor substrate into and out of the semiconductor substrate processing chamber.

In order to carry a semiconductor substrate (not shown) processed in the semiconductor substrate processing chamber, the transport arm 37 is put into the processing chamber and a processed semiconductor substrate is laid on the pan 38 and carried out of the processing chamber by moving the transport arm 37. Outside the semiconductor substrate processing chamber, the processed semiconductor substrate is taken out of the pan 38, and an unprocessed semiconductor substrate is instead laid on the pan 38 and put into the semiconductor processing change. Semiconductor substrates are transported by repeating the above processes.

Since the transport arm in the conventional semiconductor substrate transport apparatus has the above construction, it is necessary to take a processed substrate out of the semiconductor substrate processing chamber before carrying a new semiconductor substrate into the processing chamber, and to perform two extension and contraction operations of the transport arm to process one semiconductor substrate, thereby making the transport time long. Furthermore, it is necessary to open and close an entrance gate of the semiconductor substrate processing chamber in every transport operation in order to prevent the intrusion of dust into the semiconductor substrate processing chamber. The opening and closing operations take substantial time and shorten the operating life of an opening and closing driving portion for the entrance gate.

SUMMARY OF THE INVENTION

Accordingly, an object of the present invention is to provide a substrate transport arm of a semiconductor substrate transport apparatus which can carry a semiconductor substrate in one operation into and out of the processing room so as to shorten the operation time of the transport arm, and to lengthen the operating life of a driving portion since only one opening and closing operation of the entrance gate is necessary for each transport arm operation.

In order to achieve the above object, according to one aspect of the present invention, there is provided a transport arm of a semiconductor substrate transport apparatus comprising first and second arms each of which is formed with a substrate holding portion at the leading end thereof, and rotatably attached to the leading end of an extensible arm, and which first and second arms can be rotated by an arm driving device in a semiconductor substrate processing chamber.

According to another aspect of the present invention, there is provided a semiconductor substrate transport method comprising the steps of laying a semiconductor substrate on a substrate holding portion of a second arm located behind the leading end of an extensible arm, inserting the semiconductor substrate into a semiconductor substrate processing chamber by extending the extensible arm, receiving the processed semiconductor substrate on a substrate holding portion of a first arm located ahead of the leading end of the extensible arm, switching the positions of the substrate holding portions of the first and second arms by rotating the first and second arms in the processing chamber, removing an unprocessed semiconductor substrate from the substrate holding portion of the second arm for processing, and taking the processed semiconductor substrate on the first arm out of the semiconductor substrate processing chamber by contracting the extensible arm.

According to the semiconductor substrate transport apparatus of the present invention, since the first and second arms can be rotated in the processing chamber to switch the positions of the substrate holding portions of the first and second arms, it is possible to deliver a semiconductor substrate in one operation of the extensible arm, and thus to shorten the whole operation time of the apparatus. The rotations of the first and second arms in opposite directions make it possible to save the space needed for the rotations. Furthermore, since the number of opening and closing operations of the semiconductor substrate processing room can be almost reduced to half, the operation time is shortened and reliability is increased.

DESCRIPTION OF THE PREFERRED EMBODIMENTS

Figure 1:
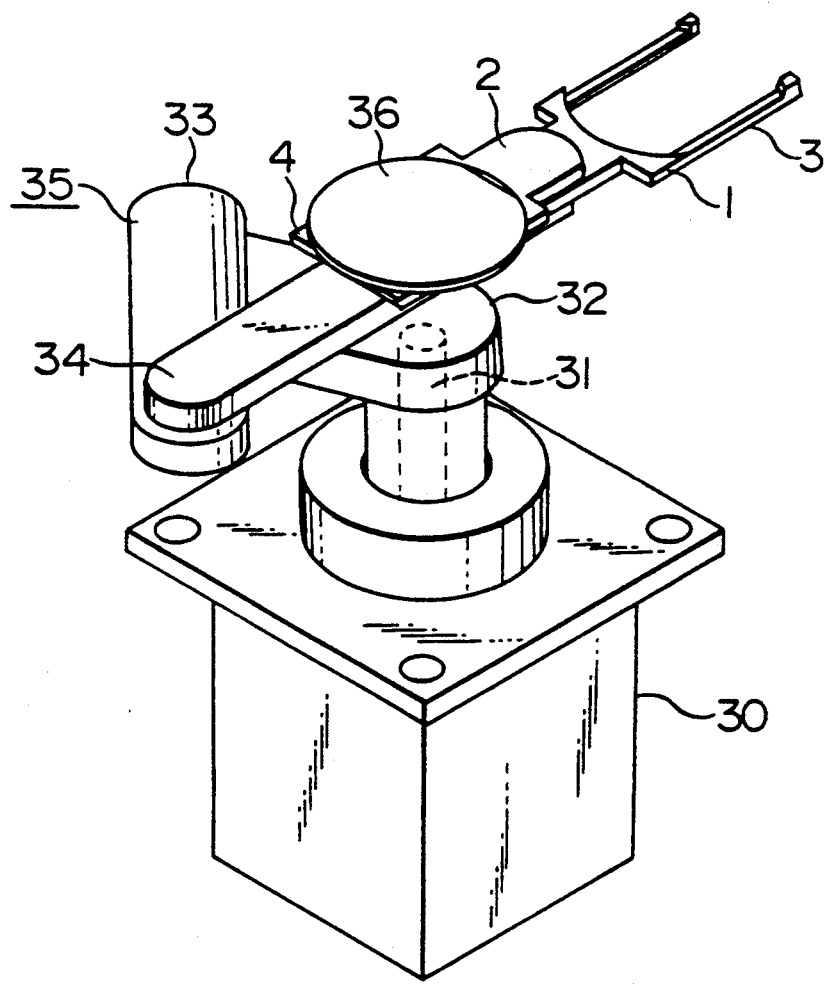
FIG. 1 is a perspective view of a semiconductor substrate transport arm in a semiconductor substrate transport apparatus according to an embodiment of the present invention.

FIGS. 1 to 4 each illustrate a semiconductor substrate transport arm according to the present invention. Referring to FIG. 1, the semiconductor substrate transport arm has an extensible arm 35 composed of a first link 32 connected to a rotary shaft 31 of a driving portion 30, a second link 33 connected to the leading end of the first link 32, and a third link 34 connected to the leading end of the second link 33. Joint portions between the links 32 to 34 each are formed with an unillustrated linking mechanism composed of a pulley and a belt made of a metal wire in order to keep the rotations of the links 32 to 34 in a fixed relation so that the third link 34 advances and retracts in the axial direction with respect to an unillustrated semiconductor substrate processing chamber to carry a semiconductor substrate 36 into and out of the semiconductor substrate processing chamber.

Figure 2:
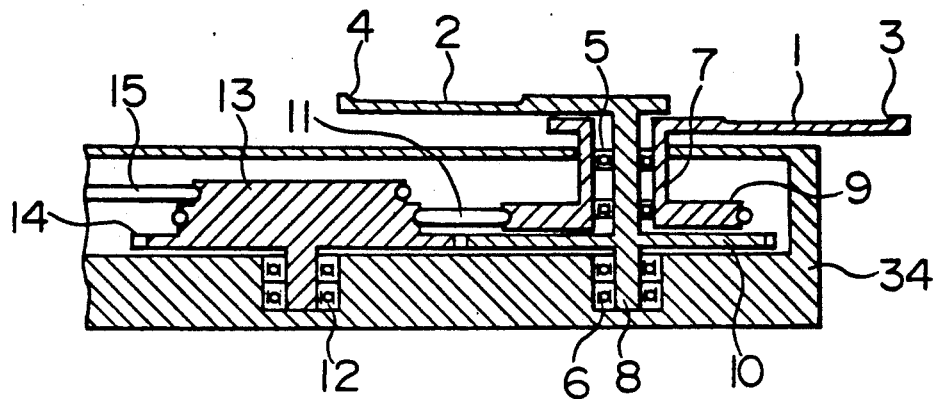
FIG. 2 is a partial sectional side view showing the leading end of the semiconductor substrate transport arm shown in FIG. 1.
Figure 3:
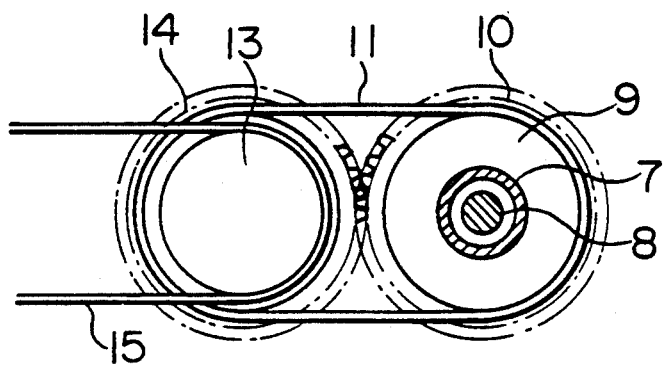
FIG. 3 is a plan view of a driving device, such as a pulley and a gear shown in FIG. 2.
Figure 4:
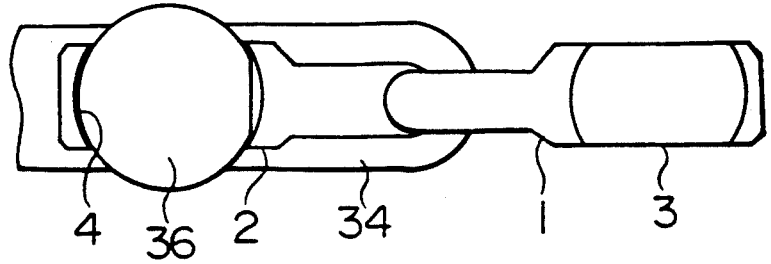
FIG. 4 is a plan view showing a semiconductor substrate held by a substrate holding portion of the semiconductor substrate transport arm.

In FIGS. 1 to 4, a first arm 1 and a second arm 2 are rotatably mounted at the leading end of the third link 34, and include first and second substrate holding portions 3 and 4 for receiving and holding the semiconductor substrate 36 at the leading ends thereof, respectively. The first and second arms 1 and 2 are rotated on the third link 34 by rotary shafts 7 and 8 through bearings 5 and 6 as shown in FIGS. 2 and 3. The first rotary shaft 7 is a hollow shaft having a pulley 9 at the bottom thereof, and supported on the second rotary shaft 8, which penetrates through the first rotary shaft 7, by the bearing 5. The second rotary shaft 8 having a gear 10 is supported by the third link 34 through the bearing 6 at the bottom thereof. The pulley 9 of the rotary shaft 7 is connected through a metal wire belt 11 to a pulley 13 which is rotatably supported by a bearing 12 in the center of the third link 34. The gear 10 of the second rotary shaft 8 engages a gear 14 which is integrally formed with the pulley 13. The pulley 13 is connected to an unillustrated pulley in the link joint portion through a belt 15, and connected to the driving portion 30 through the second and first links 33 and 32.

In order to carry the semiconductor substrate 36 into and out of a semiconductor substrate processing chamber (not shown), a semiconductor substrate 36 to be processed is laid on the second substrate holding portion 4 at the leading end of the second arm 2 in a position (first position) behind the leading end of the extensible arm 35 after contracting the extensible arm 35. Subsequently, a gate (not shown) of the semiconductor substrate processing chamber is opened, the extensible arm 35 of the substrate transport arm is extended, the leading end of the extensible arm 35 is put into the processing room through the gate, and the semiconductor substrate 36 on the extensible arm 35 is inserted into the processing chamber. At this time, the semiconductor substrate 36 is not present on the first substrate holding portion 3 of the first arm 1 in a position (first position) ahead of the leading end of the extended extensible arm 35, but is present on the second substrate holding portion 4 of the second arm 2 behind the leading end. In the semiconductor substrate processing chamber, a processed semiconductor substrate 36 is waiting to be removed, and then is laid on the first substrate holding portion 3 at the leading end of the first arm 1.

Then, driving force is transmitted from the driving portion 30 to the central pulley 13 shown in FIG. 2 through driving devices in the extensible arm 35, such as a pulley and a wire. The turning of the central pulley 13 is transmitted to the first arm 1 through the wire 11, the pulley 9 and the rotary shaft 7 so as to turn the first arm 1 through 180°, and simultaneously from the gear 14 to the second arm 2 through the gear 10 and the rotary shaft 8 so as to turn the second arm 2 through 180° in the direction opposite to the direction of the first arm 1. Such turns of the first and second arms 1 and 2 are performed in the semiconductor substrate processing chamber thereby interchanging the positions of the substrate holding portions 3 and 4 of the first and second arms 1 and 2. Therefore, the first arm 1 is in a retracted position (second position) behind the leading end of the extensible arm 35, and the processed semiconductor substrate 36 is laid on the first substrate holding portion 3. The second arm 2 is in an advanced position (second position) ahead of the leading end of the extensible arm 35, and a semiconductor substrate 36 which is to be processed is laid on the second substrate holding portion 4 of the second arm 2. The semiconductor substrate 36 to be processed can be easily moved from this position into the substrate processing chamber for processing.

Since only the semiconductor substrate 36 on which processing has been already conducted is present on the substrate transport arm in this state, it is possible to take out the processed semiconductor substrate 36 on the first arm 1 in the retracted position from the semiconductor substrate processing chamber through a gate (not shown) by contracting the extensible arm 35, and to transport the processed semiconductor substrate 36 to the next process in a well-known manner.

According to the above processes, it is possible to carry a semiconductor substrate 36 to be processed in and to carry a processed semiconductor substrate 36 out by one extending and contracting operation of the extensible arm 35 of the semiconductor substrate transport arm, that is, one opening and closing operation of the gate of the semiconductor substrate processing chamber.

Figure 5:
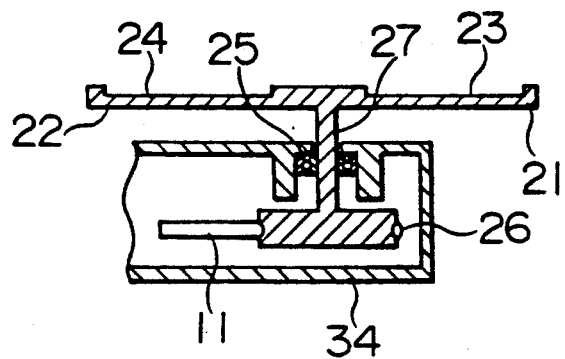
FIG. 5 is a cross-sectional view of first and second arms according to another embodiment of the present invention.
Figure 6:
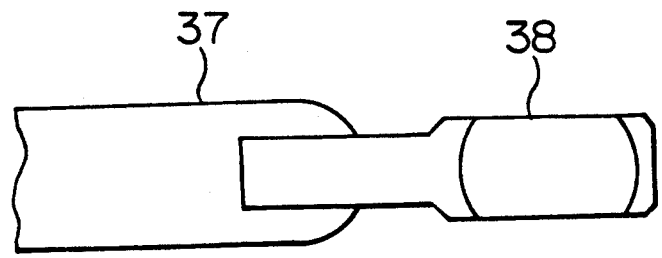
FIG. 6 is a partial plan view of a semiconductor substrate transport arm in a semiconductor substrate transport apparatus according to the prior art.

FIG. 5 illustrates another embodiment of the present invention. Substrate holding portions 23 and 24 on first and second arms 21 and 22 are integrally formed and space apart from each other by 180° through the turn axis center, and mounted to a single rotary shaft 27 supported by a bearing 25 and having a pulley 26. Although a semiconductor substrate processing chamber this embodiment must be larger than the chamber in the above embodiment in order to turn the first and second arms 21 and 22 in the same direction in the substrate processing room, the structure of the semiconductor substrate transport arm is simple and the size of a gate of the semiconductor substrate processing room may be the same as that of the first embodiment.

According to the present invention, since the positions of the semiconductor substrate holding portions, that is, pans disposed at the leading end of the extensible arm can be switched by sequentially turning the semiconductor substrate holding portions, it is possible to carry a processed semiconductor substrate out of the processing chamber and carry an unprocessed semiconductor substrate into the processing chamber by only one extending and contracting operation of the extensible arm, and thus to shorten the transport time. Furthermore, since it is necessary to open and close the gate of the processing room only once, the lives of the driving portion for transporting the semiconductor substrate and the driving portion for opening and closing the gate are prolonged.

What is claimed is:

1. A transport arm for carrying semiconductor substrates into and out of a semiconductor substrate processing chamber comprising:
an extendable arm including serially interconnected proximal, intermediate, and distal links, each of said links having a leading end and a trailing end, said proximal link being connected at its trailing end to a rotatable drive shaft for extending and retracting said extendable arm in response to rotation of said drive shaft, said intermediate link being rotatably connected at its trailing end to the leading end of said proximal link and being rotatably connected at its leading end to the trailing end of said distal link, said distal link being rotatably connected at its trailing end to the leading end of said intermediate link;

a first arm and a first rotatable shaft, said first arm being mounted on said first rotatable shaft and thereby rotatably connected to the leading end of said distal link and having a first substrate holder, said first arm being rotatable between a first position where said first substrate holder is located on a first side of the leading end of said distal link and a second position where said first substrate holder is located on a second side, opposite the first side, of the leading end of said distal link;

a second arm and a second rotatable shaft coaxial with said first rotatable shaft, said second arm being mounted on said second rotatable shaft and thereby rotatably connected to the leading end of said distal link, said second arm having a second substrate holder, said second arm being rotatable between the first position where said second substrate holder is located on the second side of the leading end of said distal link and the second position where said second substrate holder is located on the first side of the leading end of said distal link; and arm driving means for simultaneously turning said first and second rotatable shafts in opposite directions, thereby turning said first and second arms in opposite directions between the first and second positions.

2. The transport arm according to claim 1 wherein said second rotatable shaft surrounds said first rotatable shaft and said driving means comprises a pulley attached to said second rotatable shaft and an endless belt engaging said pulley for rotating said second rotatable shaft.

3. The transport arm of claim 2 wherein said arm driving means comprises a first gear attached to said first rotatable shaft and a rotatable wheel including a second gear engaging the first gear for rotating the first rotatable shaft.

4. The transport arm of claim 3 wherein said wheel includes a pulley engaging said endless belt.

* * * * *